Sept. 30, 1958

E. A. ZARATKIEWICZ 2,854,612

SILICON POWER RECTIFIER

Filed July 6, 1956

INVENTOR
EDWIN A. ZARATKIEWICZ
BY Henry Kolin
AGENT

United States Patent Office 2,854,612

Patented Sept. 30, 1958

2,854,612

SILICON POWER RECTIFIER

Edwin A. Zaratkiewicz, South Amboy, N. J., assignor to International Telephone and Telegraph Corporation, Nutley, N. J., a corporation of Maryland Application July 6, 1956, Serial No. 596,243

12 Claims. (Cl. 317—240)

Figure 1:
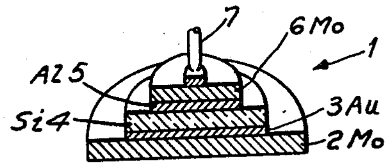

This invention relates to semiconductive circuit elements and methods for preparing them and more particularly to an improved method for preparing an alloy-junction silicon power rectifier. This invention is specifically directed to a novel silicon-molybdenum bond in such a rectifier and a method of forming it.

Junction rectifiers and transistors are well known semiconductive circuit elements and are generally prepared using either germanium or silicon as the semiconductive material. Because of the ever-increasing demand, particularly by the aviation industry, for efficient rectifiers which are light in weight and small in size and capable of being operated at elevated temperatures, considerable interest has developed in the fabrication of rectifiers capable of meeting these requirements. Silicon power rectifiers are particularly desirable because of their capabilities of use at elevated temperatures. These rectifiers generally depend upon the utilization of broad-area rectifying P–N junctions or P–I–N structures. A rectifying P–N junction consists of a zone or area of one type of conductivity contiguous with a zone of opposite conductivity type; whereas a P–I–N structure consists of a region of high conductivity, one which is lightly doped, and then a region of opposite conductivity type to that of the highly doped region.

The junction itself is generally formed by either a growing, alloying or diffusion technique.

Where the junction diode or rectifier is of the grown type, a single crystal of semiconductive material, such as silicon, for example, is grown by the so-called crystal-pulling technique in which a single-crystal seed is gradually withdrawn from a melt. The junctions are formed by selective doping of the melt, i. e., addition of significant impurities, at the desired points during the growing process. Where the junctions are formed by an alloying technique, an alloying material having significant impurities of the proper type is fused to the semiconductive material. Thus to form a P–N junction in a silicon semiconductor, a P-type-forming material is fused with N-type silicon, or an N-type forming material is alloyed with P-type silicon. As is common terminology in this art, a semiconductor of the N-type refers to material containing an excess of electrons, whereas P-type material contains a deficiency of electrons. This deficiency of electrons is frequently referred to as an excess of "holes" or of effective positive charges.

Where silicon is the semiconductive material for use in a silicon power rectifier, it has been found that in order to obtain satisfactory current-rating values, and also to establish electrical connection to other circuit devices, it is essential to have the silicon in intimate contact with some means of heat dissipation. While the bonding of silicon to a nickel-iron-cobalt alloy commercially known as "Kovar" is feasible, the bond between this material and silicon is not entirely a satisfactory one for use over a wide temperature range because of differences in thermal and electrical characteristics between the two materials. By Kovar I refer to the alloy having a nominal composition of 29 percent nickel, 17 percent cobalt, about 0.2 percent magnesium and the remainder iron.

Molybdenum, in its electrical and thermal properties more closely resembles silicon; and this, together with its high melting point, makes it a particularly satisfactory material for use as a base for a silicon power rectifier for providing heat dissipation and for serving as a means for making electrical connection to the silicon. However, the problem of bonding molybdenum to silicon to form an intimate bond satisfactory over a temperature range from −65° C. to +175° C. is a difficult one because of the severe thermal shock imposed on the system. Furthermore, in order to be able to fabricate the silicon power rectifiers on a mass production basis, it is desirable to be able to form the silicon-molybdenum bond in situ, simultaneous with the preparation of a P–N junction. A method of preparing a sandwich-type silicon rectifier utilizing the novel process of this invention has been described in the copending application of A. Jeter, filed July 6, 1956, Serial No. 596,293, and assigned to International Telephone and Telegraph Corporation, and reference may be had thereto for a fuller description of this process.

It is an object of the present invention to provide a novel molybdenum-silicon structure consisting of an adherent bond between a molydenum and a silicon body stable over a wide temperature range.

It is a further object to provide a simple method for forming the adherent molybdenum-silicon bond.

It is still a further object to provide a simple, reliable, rapid method for bonding silicon to molybdenum during the simultaneous formation of a P–N junction in the processing of a silicon power rectifier.

It is a feature of this invention that a layer of a material consisting predominantly of gold is used to bond silicon and molybdenum bodies to one another to form an adherent bond.

It is a further feature of this invention that a layer of a material consisting predominantly of gold, e. g., gold film, is placed in intimate contact with the silicon and molybdenum surfaces to be bonded and the temperature is elevated above that of the gold-silicon eutectic and below that of the melting points of either the gold, silicon, or molybdenum for a period of time sufficient to form a stable bond.

It is still a further feature of this method that the bonding is carried out in the absence of a fluxing agent and in the presence of a reducing atmosphere at a temperature sufficient from the simultaneous formation of a P–N junction on an opposite face of the silicon.

Figure 2:
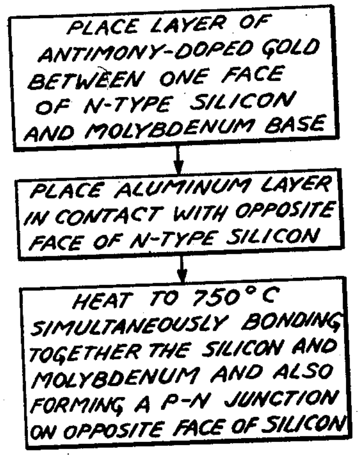

Other objects and features of this invention and the means of attaining them will become apparent from the following figures and description thereof, wherein:

Fig. 1 is a perspective view partly in section of a semiconductive unit prepared in accordance with a preferred process of this invention; and Fig. 2 is a flow chart of the steps followed in practicing a preferred embodiment of this invention.

Referring to Fig. 1, a silicon power rectifier 1 is shown consisting of a molybdenum base 2 on which a silicon die 4 of the N-type is mounted by means of an antimony-doped gold solder 3. An acceptor impurity material 5 such as aluminum is fused to the opposite upper face of the silicon die. A molybdenum electrode 6 is attached to the aluminum 5. To the molybdenum electrode 6 is also welded a nickel-clad copper wire 7.

For purposes of illustration, in accordance with a preferred embodiment of this invention as illustrated in Fig. 1, the preparation of the above-illustrated silicon rectifier will be described, although this invention is not restricted to this specific embodiment but is considered to embrace other types of fused silicon junctions. Thus where the silicon consists of an N-type material, acceptor type impurities containing elements selected from the group III elements of the periodic table such as boron, aluminum, gallium, indium, and thallium may be alloyed thereto inasmuch as these materials form P-type regions, thereby providing a P–N junction. In a similar manner, where the semiconductive material is P-type silicon, various donor impurity materials, or alloys, thereof, selected from the group V elements of the periodic table such as phosphorus, arsenic, antimony, and bismuth may be alloyed thereto thereby forming P–N rectifying junctions. These alloying impurity materials may be used in the elemental state or as significant impurities as part of an alloy, as is well known in this art.

In preparing the silicon power rectifier illustrated in Fig. 1, it is preferred to start with a single-crystal silicon ingot, which may be grown by the Czochralski pulling technique. The crystal is preferably grown in a direction perpendicular to the 111 plane. Where N-type silicon is used, materials having various resistivity is between 7 and 17 ohm-centimeters may be used. One such useful material, for example, may have a resistivity of 10 ohm centimeters and a lifetime of about 25 microseconds. The crystal is sliced into wafers approximately 25 mils (0.025 inch) thick using a diamond wheel and cutting in a direction perpendicular to the growth axis. The dice are then ground and lapped to a uniform surface finish.

After being cut into dice, the silicon is etched to a thickness of approximately 15 mils. Prior to use it is again etched in order to insure good wetting and alloying. Where the impurity material to be alloyed consists of an acceptor material such as aluminum, this is generally in the form of a wafer 0.25 inch in diameter and having a thickness of approximately 7 mils. In order to secure a good junction, high purity aluminum (99.99 percent) should be used. The aluminum, prior to assembly, to insure good alloying, is etched with a hydrofluoric acid-nitric acid mixture. The five-component silicon rectifier sandwich is preferably formed in a single operation in a suitable jig. To secure the silicon die 3 to the molybdenum base 2 a layer 4 of a predominantly gold-containing material in the form of a ribbon, leaf, sheet, or foil is placed on top of the molybdenum base 2 and under the silicon die 3 and coextensive with the latter. The gold ribbon or foil may preferably contain a donor impurity material, such as 1% by weight of antimony, where the silicon is N-type, for high-level injection of minority carriers. The aluminum layer 5 rests upon the upper surface of the silicon die 3. On top of the aluminum is placed the upper molybdenum electrode 6 to which a nickel-clad copper wire 7 had previously been attached. The entire assembly is held under tension in a helical spring holder (not shown), and this assembly unit is placed on a tungsten strip. The formation of the P–N junction and the bonding of the molybdenum to the silicon is preferably conducted in an atmosphere of pure hydrogen at a temperature of approximately 750° C. for about 15 seconds. This temperature is attained by passing a current through the tungsten strip to heat the unit to the required temperature. In order to improve the rectification characteristics, the junction may be treated in accordance with the process described in the copending application of A. Jeter previously referred to. After such a suitable treatment, the unit may be encapsulated, as is well known in this art. If desired, as is well known in rectifier technology, the electrical characteristics of the rectifier may be further improved by an electrical forming technique in which both the voltage and the current applied to a rectifier in the reverse or blocking direction are gradually increased until the rectifier has been electrically formed.

For a rectifier capable of carrying a current of approximately 7½ amperes a molybdenum disk having a diameter of 0.50 inch and a thickness of 0.015 inch is suitable as a base support for the silicon rectifier unit. In general, the bottom surface of this disk will be prepared in advance of fusion to the silicon in order to permit soldering to a copper heat sink. To insure proper bonding, the molybdenum disk is chemically cleaned with an etch consisting of 50 percent by volume sulphuric acid, 25 percent by volume nitric acid and 25 percent by volume distilled water. After cleaning, rinsing, and drying, the molybdenum disks are outgassed in an atmosphere of hydrogen for 15 minutes at 1000° C. The silicon is also etched as previously described. The gold ribbon, which preferably contains 1 percent antimony for high-level injection, is placed on top of the base molybdenum disk and rests under the silicon. The dimensions of the gold foil used are 0.319 inch in diameter with a thickness of 2 mils (0.002 inch). An etching solution consisting of two parts by volume hydrofluoric acid to one part nitric acid is used for a period of 1½ minutes to clean the gold foil prior to use. When the surfaces are prepared as described above, it is found that a satisfactory bond between the gold and silicon and gold and molybdenum will readily occur under the same conditions as that used for formation of a rectifying P–N junction, namely, at a temperature of approximately 750° C. for a period of time of approximately 15 seconds. These conditions are preferred for forming a satisfactory adherent bond stable over a wide range of temperatures. Fluxes which ordinarily are required for soft-soldering and hard-soldering operations in order to form a stable bond are dispensed with in the practice of this invention. This eliminates difficult cleaning problems or corrosion problems which may adversely affect the rectifying properties. While suitable non-oxidizing atmospheres may be used, I find it particularly desirable and preferable to conduct the bonding procedure in a reducing atmosphere. By a suitable non-oxidizing atmosphere, I refer to any gaseous atmosphere which does not react with the semi-conductor body or metals used, such as helium, neon, argon or nitrogen. Particularly preferable, however, is a reducing atmosphere such as hydrogen gas.

Although the melting point of gold is 1063° C. and of molybdenum 2625° C. and of silicon 1420° C., it has been unexpectedly found that a satisfactory bond between the molybdenum and the silicon with the gold acting as the bonding agent may readily be obtained at a temperature of approximately 750° C. Apparently, although the actual mechanism is not certain and I do not wish to be restricted to the explanation thereof, a gold-silicon eutectic alloy containing 12 percent silicon and having a melting point of 356° C. is formed by diffusion between the gold and the silicon, and this alloy wets the molybdenum surface and alloys thereto, thereby firmly bonding the silicon to the molybdenum. This reaction, which had not been known or expected on the basis of available theory and experimental data, thereby results in a firm, adherent low-resistance contact between the silicon and the molybdenum which is stable over an extensive temperature range from at least −65° C. to +175° C. By conducting the reaction in a reducing atmosphere rather than in air or in an inert atmosphere the surfaces to be bonded are maintained free from oxide formation or adventitious contamination which might interfere with the obtaining of a suitable bond.

While I have described above the principles of my invention in connection with specific method steps, it is to be clearly understood that this description is made only by way of example and not as a limitation to the scope of my invention as set forth in the objects thereof and in the accompanying claims.

I claim:

1. A method for joining a silicon body to a molybdenum body to establish a low resistance contact therebetween comprising assembling a silicon body and a molybdenum body with a layer of a material consisting predominantly of gold therebetween in intimate contact therewith and heating the assembly at a temperature below the melting point of the gold-containing material in a non-oxidizing atmosphere and in the absence of a fluxing agent to form a gold-silicon alloy and to bond said silicon and molybdenum bodies together.

2. A method according to claim 1, wherein said assembly is heated to a temperature above the eutectic temperature of the gold-silicon alloy and below the melting point of the silicon and molybdenum bodies.

3. A method according to claim 1, in which said non-oxidizing atmosphere consists principally of hydrogen gas.

4. A method according to claim 1, wherein said silicon body is of N-type and said gold material consists principally of gold alloyed with a substance selected from the group V elements of the periodic table.

5. A method according to claim 4, wherein said gold material consists essentially of gold alloyed wtih approximately 1 percent antimony by weight.

6. In a method for producing a junction-type semiconductor unit consisting of an assembly of a base plate of molybdenum, a body of semiconductive silicon having a face thereof adjacent said base plate, and a layer of a junction-forming significant impurity material in intimate contact with an opposite face of said silicon, the steps of disposing a layer of a material consisting predominantly of gold between said base plate and said silicon face and in intimate contact therewith to form part of said assembly, and heating said assembly at a temperature below the melting point of the gold-containing material simultaneously to form a rectifying junction on the opposite face of said silicon and to bond said silicon and molybdenum bodies together.

7. A method according to claim 6, wherein said heating step is at a temperature of approximately 750° C.

8. In a method for producing a junction-type semiconductor unit consisting of an assembly of a base plate of molybdenum, a body of N-type silicon having a face thereof adjacent said base plate, and a layer of a junction-forming acceptor impurity material consisting principally of aluminum in intimate contact with an opposite face of said silicon, the steps of disposing a layer of a material consisting predominantly of gold containing approximately one percent antimony by weight between said base plate and said silicon face and in intimate contact therewith to form part of said assembly, and heating said assembly at a temperature of approximately 750° C. for a period of time sufficient simultaneously to form a rectifying junction on the opposite face of said silicon and to bond said silicon and molybdenum bodies together.

9. A molybdenum-silicon structure comprising a silicon body, a molybdenum body adjacent said silicon body and a layer of a material consisting predominantly of gold disposed therebetween and in intimate contact therewith joining said bodies to form an adherent bond.

10. A silicon power rectifier comprising a base plate of molybdenum, a body of semiconductive silicon having a face thereof adjacent said base plate, a layer of a material consisting predominantly of gold disposed between said silicon face and said molybdenum and in intimate contact therewith, and a layer of a junction-forming significant impurity material in intimate contact with an opposite face of said silicon.

11. A silicon power rectifier comprising a base plate of molybdenum, a body of N-type silicon having a face thereof adjacent said base plate, a layer of a material consisting predominantly of gold containing approximately 1 percent antimony by weight disposed between said silicon face and said molybdenum and in intimate contact therewith, and a layer of a junction-forming acceptor impurity material consisting principally of aluminum in intimate contact with an opposite face of said silicon.

12. A silicon power rectifier comprising a base plate of molybdenum, a body of N-type silicon having a face thereof adjacent said base plate, a layer of a material consisting principally of gold alloyed with a substance selected from the group V elements of the periodic table disposed between said silicon face and said molybdenum and in intimate contact therewith, and a layer of a junction-forming significant impurity material in intimate contact with an opposite face of said silicon.

References Cited in the file of this patent

UNITED STATES PATENTS

| | | |
|---|---|---|
| 2,441,603 | Storks et al. | May 18, 1948 |
| 2,736,847 | Barnes | Feb. 28, 1956 |

Disclaimer 2,854,612.—*Edwin A. Zaratkiewicz*, South Amboy, N.J. SILICON POWER RECTIFIER. Patent dated Sept. 30, 1958. Disclaimer filed Apr. 9, 1962, by the assignee, *International Telephone and Telegraph Corporation.*

Hereby enters this disclaimer to claims 1, 2, 6, 7, 9, and 10 of said patent.

[*Official Gazette May 22, 1962.*]